United States Patent [19]

Kitada et al.

[11] Patent Number: 5,010,433
[45] Date of Patent: Apr. 23, 1991

[54] MAGNETORESISTIVE MAGNETIC HEAD HAVING A SHUNT FILM OF NB

[75] Inventors: Masahiro Kitada, Hamura; Noboru Shimizu, Tokorozawa; Hideo Tanabe, Higashi-murayama; Hitoshi Nakamura, Hachiouji, all of Japan

[73] Assignee: Hitachi, Ltd., Tokyo, Japan

[21] Appl. No.: 310,922

[22] Filed: Feb. 16, 1989

[30] Foreign Application Priority Data

Feb. 26, 1988 [JP] Japan .................................. 63-41987

[51] Int. Cl.$^5$ ............................................. G11B 5/127
[52] U.S. Cl. ..................................................... 360/113
[58] Field of Search ......................................... 360/113

[56] References Cited

U.S. PATENT DOCUMENTS 4,663,607  5/1987  Kitada .............................. 360/113 X
4,663,684  5/1987  Kamo ................................ 360/113

*Primary Examiner*—A. J. Heinz
*Attorney, Agent, or Firm*—Antonelli, Terry, Stout & Kraus

[57] ABSTRACT

In a magnetoresistive magnetic head which has a permalloy film as the magnetoresistive film and also has a shunt film for applying a transverse biasing magnetic field, an Nb film having an electrical resistivity of not more than 30 $\mu\Omega$cm is formed as the shunt film by the electron-beam evaporation method to increase the heat resistance of the magnetoresistive element, thus making it possible to increase the temperature at which the magnetic head is manufactured.

9 Claims, 1 Drawing Sheet

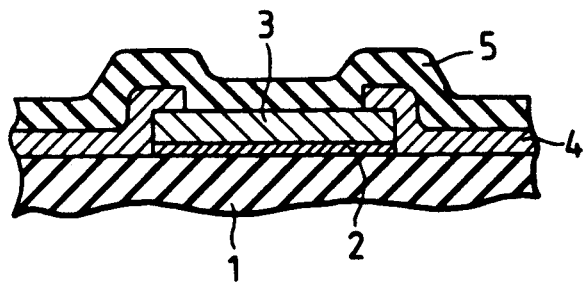
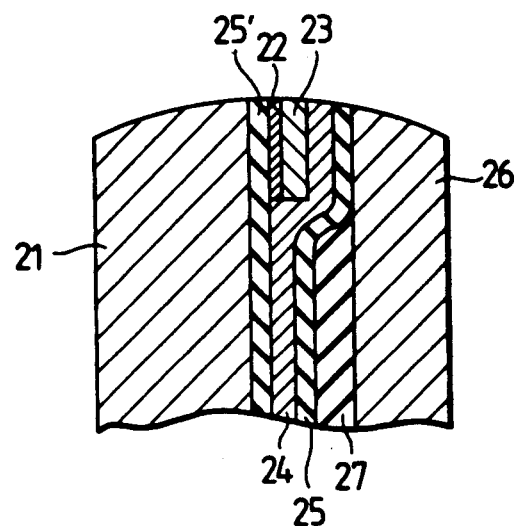
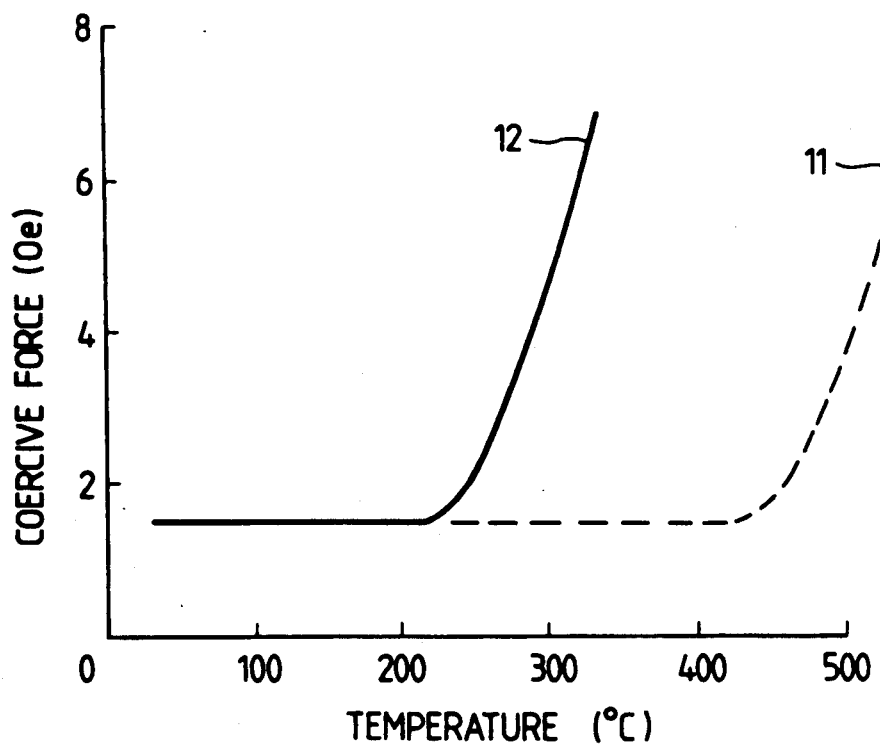

MAGNETORESISTIVE MAGNETIC HEAD HAVING A SHUNT FILM OF NB

BACKGROUND OF THE INVENTION

This invention relates to a magnetic head which uses a shunt biasing magnetoresistive element having a shunt film for applying a transverse biasing magnetic field, and more particularly to a magnetoresistive magnetic head suitable for reading a high-density magnetic recording medium.

As the materials for the shunt film, the conventional shunt biasing magnetoresistive heads use Ti, Ta, Mo, Au Nb or the like as described in the U.S. Pat. Nos. 3,940,797 and 4,663,684 or Zr as described in the Japanese Patent Application Laid-Open No. 128015/1987 (corresponding U.S. patent application Ser. No. 936,617).

In the conventional shunt biasing magnetoresistive head using Ti (titanium), when the temperature rises above 175° C., a reaction occurs between the Ni-Fe alloy (referred to as permalloy hereafter) film formed on the substrate and Ti, deteriorating the characteristic of the permalloy film as a magnetoresistive film. Manufacture of the head requires a variety of processes. There are some processes that can be desirably carried out at temperatures of 175° C. or higher, such as a conductor film forming process, an insulating film forming process and a shielding film forming process. However, there is a problem that to limit the characteristic deterioration of the head, those processes requiring the temperature of 175° C. or higher cannot be used. A Ta (tantalum) film has a high temperature of 350° C. at which the reaction between Ta film and permalloy film starts, but it has a low corrosion resistance compared with the permalloy and Ti. Also, it has an extremely high electrical resistivity of 90 to 200 $\mu\Omega$cm and thus is not appropriate for the shunt film. When the magnetoresistive film is formed of permalloy, the electrical resistivity of the shunt film should preferably be almost equal to or up to 5 times that of the permalloy film, i.e., 20 to 100 $\mu\Omega$cm. A smaller value is of course desirable. The above permalloy is an alloy of 7-27 wt % Fe and Ni and often used for the magnetoresistive film. An Mo film also does not react with the permalloy film up to 400° C., but its corrosion resistance is very bad. An Au film reacts with the permalloy film at a low temperature of 150° C. and thus poses a similar problem like that of the Ti film. In the heads which use Zr as a shunt film, the temperature at which the reaction with permalloy film starts increases to 325° C., which is, however, still low considering the temperatures of various other processes for making heads.

In the above conventional techniques, the Nb film used as a shunt film is formed by the sputtering method. Drawbacks of the shunt film thus formed include a very high electrical resistivity of 90 to 200 $\mu\Omega$cm, a poor corrosion resistance and a tendency of easily reacting with the permalloy film. The Nb film formed by the conventional technique is therefore not suited for the shunt film.

As described above, the shunt films so far known are not satisfactory. Information on the current situation of the technical field of this invention may be gained from the U.S. Pat. No. 3,864,751.

SUMMARY OF THE INVENTION

The object of this invention is to provide a magnetoresistive magnetic head which has a shunt film with high heat resistance suitable for a shunt biasing magnetoresistive head, and the method of manufacturing such heads.

To achieve the above objective, the magnetoresistive magnetic head of this invention has a two-layer film, which consists of an Ni-Fe alloy (so-called permalloy) film containing 7-27 wt % of Fe and a virtually remaining percentage of Ni and an Nb film with an unavoidable and negligibly small amount of impurities which is formed by the known electron-beam evaporation method. The permalloy film serves as the magnetoresistive film and the Nb film as the shunt film for applying the transverse biasing magnetic field. The magnetic head also has electrodes to apply current to the magnetoresistive element and detect a change in resistance of the magnetoresistive film. The materials of the substrate on which these films are formed include non-magnetic materials such as glass and ceramics and soft magnetic materials such as high permeability ferrite. A block or thick film of soft magnetic material may be provided on one or both sides of the magnetoresistive element to concentrate the magnetic flux from the magnetic recording medium and protect the magnetoresistive element. The block of soft magnetic material can also serve as a substrate on which the magnetoresistive element is mounted. When the soft magnetic material has low resistance, it is preferred that the soft magnetic material be provided on the surface of the magnetoresistive element with an insulating film interposed therebetween. When the soft magnetic material is provided on each side of the element, they are expected to produce a shielding effect.

As is known, the thickness of the magnetoresistive film made of permalloy is preferably 50 to 1000 Å A and more preferably 300 to 500 Å. Below 50 Å, the film becomes discontinuous making the rate of change of magnetic resistance very small and electrical resistivity very large. This is not desirable. Above 1000 Å, when the film is formed into the magnetoresistive element, the shape effect is large, resulting in substantial reduction in effective permeability of the element. This requires increasing the element current to secure a sufficient level of output. But the increase in the element current is not desirable because it increases the heat generation and noise.

The thickness of the shunt film made of Nb is preferably about 1 to about 2 times the thickness of the permalloy film. The electrical resistivities of the shunt film and the magnetoresistive film are preferably made almost equal. The Nb film formed by the electron-beam evaporation method as the shunt film has the electrical resistivity of 28 to 30 $\mu\Omega$cm, while the electrical resistivity of the permalloy film as the magnetoresistive film is 18 to 24 $\mu\Omega$cm. Thus, if the shapes of the two films are the same, the range of Nb film thickness is, as mentioned above, about 1 to about 2 times the thickness of the permalloy film. Therefore, if the thickness of the permalloy film is in the range of 50 Å to 1000 Å and 300 Å to 500 Å, then the Nb film thickness will be in the range of 50 Å to 2000 Å and 300 Å to 1000 Å.

This invention uses the electron-beam evaporation method in forming the Nb film as the shunt film, so that the electrical resistivity of the Nb film can be reduced to a sufficiently low level.

The corrosion resistance of the Nb film and its reaction with the permalloy film depend on the Nb purity and the internal defect structure of the Nb film. The internal defect structure vary greatly according to the conditions of Nb film formation. The Nb film formed by the sputtering method has a small amount of argon gas trapped in Nb, forming the internal defects, which in turn increases internal stresses and therefore reduces corrosion resistance. The density of grain boundary, i.e., the grain diameter of the Nb film, which is an important factor affecting the corrosion resistance, depends on the substrate temperature when the Nb film is formed. When the Nb grain sizes are small, a grain boundary corrosion occurs.

In the process of forming the Nb film by the electron-beam evaporation, when the substrate temperature is set to 150° C. or higher with the vacuum level at $10^{-6}$ to $10^{-8}$ Torr and the Nb source purity at 99.9 wt %, the Nb film thus obtained has a grain size that assures a sufficiently high corrosion resistance to allow practical us of it. For more improved corrosion resistance of the Nb film, the substrate temperature need be increased. However, when the substrate temperature exceeds 400° C., reaction between Nb and permalloy occurs, deteriorating the permalloy film. It is therefore desired that the substrate temperature be set at 400° C. or lower.

The magnetic characteristic of the permalloy film deteriorates as the substrate temperature exceeds 350° C. because of grain growth, so that the vapor deposition of Nb film on the permalloy film should be carried out at temperatures of 350° C. or lower. For the substrate temperatures of less than 100° C., the Nb grain sizes are small so that grain boundary diffusion of permalloy components i.e. Ni and Fe into Nb becomes conspicuous. From this aspect also, the substrate temperature during Nb evaporation is preferably set at 150° C. or higher. In other words, the desirable substrate temperature during the process of depositing the Nb on the permalloy film by the electron-beam evaporation is in the range of 150° to 350° C. The permalloy is easily affected by stresses caused by magnetostriction and if the substrate temperature during Nb evaporation is less than 150° C., the internal stresses of Nb will be large, deteriorating its magnetic characteristic. From this point also, the substrate temperature at time of Nb evaporation should prefereably be 150° C. or higher. Sputtering should not be used in forming the Nb film because the surface of the permalloy film is irradiated with argon ions, causing deterioration of the magnetic characteristic and reaction between permalloy and Nb.

This invention has been accomplished by focusing our attention on the fact that the object of this invention can be achieved by using an Nb film having a high temperature at which the reaction with the permalloy film starts and having a electrical resistivity suited to the shunt structure. Which combination of metal films is suited for the multi-layered film can be known only by actually fabricating the elements using various kinds of films and then evaluating them. When viewed in terms of reaction, the promising metals will be those with high melting points because the reaction depends on thermal activation of atoms. At the same time, the prospective metal should have an excellent corrosion resistance. The Nb film formed by the electron-beam evaporation method exhibits good characteristics with respect to the above points.

That is, the Nb film formed as the shunt film by the electron-beam evaporation according to this invention has an electrical resistivity of 28 to 30 $\mu\Omega$cm, a melting point of about 2467° C. and an excellent corrosion resistance. Our experiments have found that if the Nb film formation condition is optimized, the reaction inception temperature of permalloy film and Nb film is about 200° C. higher than that of permalloy film and Ti film.

BRIEF DESCRIPTION OF THE DRAWINGS

FIG. 1 is a cross-sectional view of a magnetoresistive magnetic head as one embodiment of this invention;

FIG. 2 is a graph showing the relationship between the heat treatment temperature and the coercive force of permalloy film in one embodiment of the invention and the corresponding relationship in another example for comparison; and FIG. 3 is a cross-sectional view of a magnetoresistive magnetic head as another embodiment of the invention.

DESCRIPTION OF THE PREFERRED EMBODIMENTS

Embodiment 1

FIG. 1 is a cross-sectional view of a magnetic head of this embodiment. On a glass substrate 1 is formed, by an electron-beam evaporation method, a thin permalloy film 2 with a composition of Ni-19 wt % Fe. The permalloy film is 400 Å in thickness. On this permalloy film, successively, a thin Nb (niobium) film 3 is formed by the electron-beam evaporation method to a thickness of about 700 Å, without breaking a vacuum. These two layers of films are called an Nb/permalloy film hereafter. Further, on the Nb/permalloy film are formed Al (aluminum) electrodes 4 by a vacuum evaporation method. Then an SiO$_2$ film 5 is formed over the entire surface as a protective film to the thickness of 0.15 $\mu$m by a sputtering method. Now the magnetoresistive magnetic head is obtained.

The deposition by the electron-beam evaporation of the Nb film 3 was performed at the vacuum level of $10^{-6}$ to $10^{-8}$ Torr, input power of 10 kW and substrate temperature of 150° to 300° C. The Nb material used was plate-shaped with a purity of 99.9 wt %. When the SiO$_2$ film was formed by sputtering, the substrate including the niobium/permalloy film and the Al electrodes was heated at 150° C. Increased substrate temperature improves the adhesion of the SiO$_2$ film. A similar effect is obtained if an Al$_2$O$_3$ film is used instead of the SiO$_2$ film.

Another sample was produced for comparison with the above sample. This sample consists of a Ti/permalloy film, which was formed on the same glass substrate as in the first sample by forming a permalloy film of the same composition as in the first sample and size and then, successively, a Ti film which was formed in a manner similar to that used in making the Nb film. Then, as in the above sample, Al electrodes and an SiO$_2$ film were formed.

For comparison of these samples under the same conditions, they are placed and heat-treated in a furnace at the vacuum level of $10^{-7}$ Torr FIG. 2 shows changes in coercive force of the permalloy film according to the heat treatment temperature. The samples were heated for two hours. In FIG. 2, a curve 11 represents a case where the shunt film was formed of Nb film by the electron-beam evaporation and a curve 12 represents a case where it was formed of Ti film (a second sample for comparison).

As is seen from FIG. 2, the coercive force of the Ti/permalloy 2-layer film begins to increase as the heat treatment temperature becomes higher than 225° C. This indicates that the magnetic characteristic of the permalloy is deteriorated by the interdiffusion between the Ti and permalloy films and other factors. On the other hand, in the Nb/permalloy film that was formed under the conditions of this invention, the coersive force of the permalloy shows no change up to 400° C. and, at temperatures higher than 425° C., it shows a slight increase, indicating that reaction occurs between the two films.

As is seen from the above, Nb has a high reaction temperature, about 200° C. higher than that of Ti, and exhibits a remarkable effect in improving the heat resistance of permalloy in the two-layer film of permalloy and other metal.

The examination on the corrosion resistance of the Nb film with no protective $SiO_2$ film 5 formed thereon has found that the corrosion resistance of the Nb film is equal to or higher than that of the Ti film.

Two types of shunt biasing magnetoresistive heads, one formed of Ti/permalloy two-layer film and one formed of Nb/permalloy two-layer film, were compared for magnetic reproducing characteristics. After the manufactured heads were heat-treated at 225° C., the reproduced waveforms were checked. The reproduced waveform of the head using the Ti/permalloy film showed a high level of noise, which is considered to have been caused by the Barkhausen effect. The head using the Nb/permalloy film, on the other hand, showed no such noise in the reproduced waveform. With the head using the Ti/permalloy film, no reproduced output can be obtained at the heat treatment temperatures of more than 275° C., while the head using the Nb/permalloy film produces normal reproduced outputs up to 400° C. and, at heat treatment temperatures higher than 425° C., shows an increase in noise.

The electrical resistivity of a Ti film, which is formed by ordinary electron-beam evaporation method, is 55 to 60 $\mu\Omega cm$, while the electrical resistivity of Nb film formed by the electron-beam evaporation method is 28 to 30 $\mu\Omega cm$, about one-half of that of Ti film. This means that the shunt biasing film thickness can be reduced to about one-half that of Ti film. This gives rise to an advantage also that the shielding magnetoresistive head can be manufactured with the shielding distance (generally called a gap) narrowed by as much as the reduction in the shunt film thickness.

The Nb/permalloy two-layer film can be applied similarly for all driving modes such as two-terminal elements and three-terminal differential type elements.

Embodiment 2

FIG. 3 shows the cross section of a second embodiment of the magnetic head.

On a substrate 21 of Ni-Zn ferrite, an $SiO_2$ film 25' of 0.6 $\mu m$ thick is formed by the sputtering method. Then, as in the first embodiment, an Ni-19 wt % Fe alloy (permalloy) film 22, an Nb film 23, Al electrodes 24, and an $SiO_2$ film 25 of 0.15 $\mu m$ thickness are formed in that order. After this, an Ni-Zn ferrite block 26 is attached to the surface by using a bonding agent 27 of thermosetting resin such as epoxy resin.

The magnetoresistive magnetic head thus produced exhibited an excellent characteristic almost equal to that of the first embodiment. Furthermore, the reproducing sensitivity was considerably higher than that of the first embodiment.

In the first and second embodiments, the permalloy film, Nb film and electrodes were shaped by a known technique of photolithography.

As described above, with this invention it is possible to increase the maximum allowable temperature of the shunt biasing magnetoresistive element using Nb/permalloy films by as much as about 200° C. from that of conventional elements using Ti/permalloy films, so that the process of manufacturing the magnetic heads using the Nb/permalloy films can use a heat treatment temperature about 200° C. higher than that used in the manufacture of conventional magnetic heads. This has resulted in many advantages such as improved adhesion between the permalloy film and the base material, improved adhesion between the Nb/permalloy film and the insulating oxide film formed thereon, improved characteristics of the evaporated permalloy film for shielding, and significant reduction in element failures due to electromigration. All these in turn have greatly contributed to improvement in yield of elements, reduction in failure rates, and reduction in failures during use. With these advantages, the head according to this invention has proved to be suitable for reading the high-density magnetic recording medium.

What is claimed is:

1. A magnetoresistive magnetic head comprising:
    a two-layer film consisting of a magnetoresistive film and a shunt film, the magnetoresistive film being formed of an Ni-Fe alloy film which contains 7 to 27 wt % of Fe and a virtually remaining percentage of Ni, and the shunt film being formed of an Nb film having an electrical resistivity of not more than 30 $\mu\Omega cm$ and being deposited by the electron-beam evaporation method.

2. A magnetoresistive magnetic head as set forth in claim 1, wherein the thickness of the Nb film is 50 Å to 2000 Å.

3. A magnetoresistive magnetic head as set forth in claim 1, wherein the thickness of the Nb film is 300 Å to 1000 Å.

4. A magnetoresistive magnetic head as set forth in claim 1, wherein the thickness of the Nb film is 1 to 2 times that of the Ni-Fe alloy film.

5. A magnetoresistive magnetic head as set forth in claim 1, wherein the substrate temperature during the process of the electron-beam evaporation method is 150° to 300° C.

6. A magnetoresistive magnetic head as set forth in claim 1, wherein the magnetoresistive element having the two-layer film is constructed as a three-terminal differential type element.

7. A magnetoresistive magnetic head as set forth in claim 1, wherein the electron-beam evaporation method is carried out at 150° to 350° C.

8. A magnetoresistive magnetic head comprising:
    a two-layer film consisting of a magnetoresistive film and a shunt film, the magnetoresistive film being formed of an Ni-Fe alloy film which contains 7 to 27 wt % of Fe and a virtually remaining percentage of Ni, and the shunt film being formed of an Nb film having an electrical resistivity of not more than 28 to 30 $\mu\Omega cm$ and being deposited by the electron-beam evaporation method.

9. A magnetoresistive magnetic head as set forth in claim 8, wherein the electron-beam evaporation method is conducted at 150° to 350° C.

* * * * *